US007005919B2

(12) United States Patent
Petrovic et al.

(10) Patent No.: US 7,005,919 B2
(45) Date of Patent: Feb. 28, 2006

(54) EVEN ORDER DISTORTION ELIMINATION IN PUSH-PULL OR DIFFERENTIAL AMPLIFIERS AND CIRCUITS

(75) Inventors: Branislav Petrovic, La Jolla, CA (US); Cong Nguyen, San Diego, CA (US)

(73) Assignee: Broadband Innovations, Inc., San Diego, CA (US)

( * ) Notice: Subject to any disclaimer, the term of this patent is extended or adjusted under 35 U.S.C. 154(b) by 2 days.

(21) Appl. No.: 10/518,577

(22) PCT Filed: Jun. 26, 2003

(86) PCT No.: PCT/US03/20064

§ 371 (c)(1),
(2), (4) Date: May 13, 2005

(87) PCT Pub. No.: WO2004/004307

PCT Pub. Date: Jan. 8, 2004

(65) Prior Publication Data

US 2005/0237112 A1    Oct. 27, 2005

Related U.S. Application Data

(60) Provisional application No. 60/391,671, filed on Jun. 27, 2002.

(51) Int. Cl.
*H03F 1/26* (2006.01)
(52) U.S. Cl. .................................. 330/149; 330/124 R
(58) Field of Classification Search ................ 330/149, 330/124 R, 295, 84, 302; 455/126
See application file for complete search history.

(56) References Cited

U.S. PATENT DOCUMENTS

| 3,699,465 | A | | 10/1972 | Pranke | |
|---|---|---|---|---|---|
| 3,895,306 | A | | 7/1975 | Rebeles | |
| 4,887,045 | A | * | 12/1989 | Nakayama | ................... 330/69 |
| 5,281,924 | A | | 1/1994 | Maloberti et al. | |
| 5,568,089 | A | | 10/1996 | Maru | |
| 6,204,731 | B1 | * | 3/2001 | Jiang et al. | ................. 330/310 |
| 6,211,734 | B1 | | 4/2001 | Ahn | |
| 6,469,581 | B1 | * | 10/2002 | Kobayashi | ................... 330/295 |
| 6,636,116 | B1 | * | 10/2003 | Cameron | ..................... 330/260 |

* cited by examiner

*Primary Examiner*—Henry Choe
(74) *Attorney, Agent, or Firm*—Nath & Associates PLLC; Gregory B. Kang; Derek Richmond

(57) ABSTRACT

A method for improving or eliminating second harmonic and higher even order distortion terms and balance of fundamental signals in push-pull amplifiers and other differential circuits is disclosed. A common-mode (CM) signal is generated as a sum of two complementary (out of phase) signals in a summation network. The CM signal contains even order distortion terms only, while the fundamental signal and odd order distortion terms are canceled, thus providing a correction signal that can be used to reduce even order distortion terms, by injecting the correction signal, with proper phase and amplitude, into suitable circuit nodes. For feedback, the correction signal is injected at the input of the amplifiers, for feed-forward, it's injected at the output. The correction signal can be amplified to higher levels and injected into the circuit, without affecting gain of fundamental signals; and can result in significant even order distortion improvements, and improved balance of complementary fundamental signals.

29 Claims, 8 Drawing Sheets

EVEN ORDER DISTORTION ELIMINATION IN PUSH-PULL OR DIFFERENTIAL AMPLIFIERS AND CIRCUITS

This application claims the benefit of Provisional Application No. 60/391,671, filed Jun. 27, 2002.

BACKGROUND OF THE INVENTION

1. Field of the Invention

This invention relates to elimination or improvements of second order and higher (even) order distortion products in differential and push-pull amplifiers and circuits, and more specifically to exemplary push-pull amplifiers used in multichannel systems such as cable TV (CATV) head-ends, distribution amplifiers in CATV plants or in subscribers homes, necessary for transmission of analog TV signals, digital QAM signals used in digital TV and high speed modems for Internet communications, and more particularly to use of this method in improved agile frequency conversion apparatus (up-converter), to ensure: that distortion specification for the multichannel system is met, but also in high speed digital, GHz range differential clock drives requiring very good balance and duty cycle, and other applications requiring good signal balance and low distortions.

2. Background of the Related Art

In cable television multichannel systems, the frequency band allocated for the service spans over several octaves, from about 50 MHz through 870 MHz and above. In this and other multi-octave systems many distortion products, such as second harmonic, third harmonic and in some cases higher order harmonics, if any, fall in-band, i.e. fall on other simultaneously transmitted channels in the band, where such harmonic distortion products can cause signal quality degradation and overall system performance degradation. Particularly troublesome is the second harmonic product, which is often the strongest and most notorious term. Attenuating these distortion components to reach acceptable levels of system performance poses one of the more significant and challenging problems faced by designers of such broadband multichannel systems.

By far the most widely used solution in the prior art addressing second harmonic distortion problem is the infamous push-pull amplifier, illustrated in FIG. 1A. The push-pull topology and it's merits are well known and documented in the industry. The main value of a push-pull structure is in it's inherent ability to cancel the second order and other even order distortion terms.

The basic principle of the second harmonic cancellation can be understood by inspecting FIG. 1A. A spectrally clean, harmonic-free input signal of frequency fs, as illustrated in spectrum plot 4, is split by transformer 6 in two arms: the in-phase arm 8 and out-of phase arm 10. The complementary phase relationship of the two signals is depicted by the sense of the arrows in spectrum plots 12 and 14. These signals are amplified in inventing amplifiers 16 and 18. Each amplifier is an inverter having a gain (−A) and non-linear second order distortion, designated as D. The non-linearity of each amplifier generates second harmonic distortion (at frequency 2fs), which appears at each of the outputs (24 and 26), along with the fundamental frequency fs, as shown in spectrum plots 28 and 30, where the relative level of fundamental signals fs is designated as 0 dB and the level of second harmonics as Dn. While fundamental signals fs at the output of the amplifiers remain out-of-phase with one another, the second harmonics are in phase with each other. This is because the second harmonic is generated by the quadratic non-linearity of the amplifier, and therefore is proportional to the square of the fundamental signals as expressed in eq. (1) below. By operation of squaring, the sign difference between the two arms disappears, and it results in both arms having the same (positive) sign of the second order term.

The output transformer 32 performs the operation of subtraction of the two output signals 24 and 26. The subtraction results in summation of fundamental signals (as well as odd order distortion terms), since they are out of phase with one another, and canceling of the second harmonics, since they are in phase with each other. The cancellation will occur in the same way with all other even order harmonics, (fourth, sixth, etc.). However, the higher order terms are progressively much lower than the second harmonic and are usually negligible. The summation of fundamental signals results in 6 dB level (voltage) increase, and the distortion level is reduced to a residual level of $\epsilon Dn$, as depicted in the output spectrum plot 34.

It is well known in the art that the improvement in the distortion with push-pull structure directly depends on the circuit balance, such as the balance of amplifiers gain and impedance match, symmetry and matching of the baluns (BALanced to UNbalanced transformers), etc. Any imbalance, in the circuit will reduce the amount of achievable cancellation of second and higher order distortion terms. With reference to FIG. 1A, the signal at the output 36 of the push-pull amplifier can be represented with the following equation:

$$Vout = G_n \cdot \left[ Vin + \varepsilon \cdot D_n \left( \frac{Vin}{2} \right)^2 \right] \quad (1)$$

where:
Vout=output signal voltage
Vin=input signal voltage
Gn=gain of each arm.
Dn=second order distortion in each arm (ratio of distortion voltage and signal voltage)
$\epsilon$=total imbalance in the push-pull circuit From eq. (1) it can be found that the second harmonic improvement due to push-pull topology over single ended amplifier is: equal to 20 log ($\epsilon$). For a theoretical case of $\epsilon$=0 (perfect balance), the distortion term would be completely canceled. In practice, in a well designed CATV push-pull circuit, using state of the art RF integrated circuits (RFIC) with dual monolithic matched amplifiers and well built baluns, the achievable improvement of the second harmonic distortion is limited by circuit imbalances to no better than 20 to 25 dB ($\epsilon$ in the order of 0.1) over that of a single-ended amplifier.

For additional distortion improvements, the most extensively used method in the prior art is the negative feedback applied to each of the two push-pull amplifiers. It is well known in the art that negative feedback improves linearity and reduces distortion, not only of second order terms, but also of all other even and odd order distortion terms. However, the down side of the negative feedback is that it causes reduction of the amplifier gain, as shown in eq. (4) below. In consequence, to maintain the same RF output power, this loss of gain must be compensated by increase of the input drive level to the push-pull stage. This places additional burden on the previous (driver) stage, requiring both higher gain and higher output level signal handling capability of that stage. The acceptable reduction in gain is often the limit of how strong a negative feedback can be applied. The trade-off between distortion improvements and loss of gain with negative feedback can be found with the help of equations (2) through (7):

The gain of a single-ended amplifier without a feedback can be expressed with equation (2) and the distortion of the same amplifier with eq. (3):

$$\text{Signal Gain (without } FB) = \frac{Vos}{Vis} = -A \quad (2)$$

$$\text{Output Distortion (without } FB) = D = \frac{Vd}{Vos} \quad (3)$$

where:
Vis=input signal voltage
Vos=output signal voltage
Vd=distortion signal voltage at amplifier output Adding negative feedback to the amplifier, the gain and distortion of the feedback amplifier can be derived with the help of FIG. 1B and FIG. 1C, respectively:

$$\text{Signal Gain (with negative } FB) = G_n = \frac{Vos}{Vis} = \frac{-A}{1 + \beta_n A} \quad (4)$$

$$\text{Output Distortion Level (with negative } FB) = Vod = \frac{Vd}{1 + \beta_n A} \quad (5)$$

where Vod is output distortion voltage, βn is the negative feedback ratio coefficient and (−A) is the amplifier gain.

The non-linear distortion in most amplifiers occurs at the amplifier's output, because that's where the signal levels are the highest and a load is driven. This assumption is used in the model for distortion in FIG. 1C, where the distortion voltage Vd is shown as if being injected at the output of the amplifier. Eq. (5) was derived based on this model.

In the above equations, both quantities βn and A can be complex numbers. The phase margin of the open loop gain (βnA) must be sufficient in order to maintain stability and prevent positive feedback and potential parasitic oscillations. Ideal phase of the open loop gain βnA is 0°. The rule of thumb for the phase margin in general is that it should not exceed 60° in order to maintain circuit stability.

Dividing eq. (5) by Vos and substituting eq. (3) in (5), distortion improvement due to negative feedback can be computed:

$$\text{Output Distortion (with negative } FB) = D_n = \frac{Vod}{Vos} = \frac{D}{(1 + \beta_n A)} \quad (6)$$

From eq. (4) it can be seen that the gain reduction due to negative feedback is equal to the magnitude |1+βnA| of the denominator, and from eq. (6) it follows that the distortion is improved exactly by the same factor.

Substituting eq. (4) and (6) in eq. (1), the equation for the output signal of the push-pull amplifier of FIG. 1A, a consolidated equation expressing the effects of the negative feedback can be obtained:

$$\text{Vout (with negative } FB) = \frac{A}{(1 + \beta_n A)} \left[ Vin + \varepsilon \frac{D}{(1 + \beta_n A)} \left( \frac{Vin}{2} \right)^2 \right] \quad (7)$$

With eq. (7), the same conclusion reached previously can be confirmed, and that is that with negative feedback the distortion is improved at the expense of gain, and consequently the improvement is limited by the available excess gain of the amplifier, as well as by the available gain and signal handling capabilities of the previous stages driving the push-pull amplifier, necessary to compensate for the loss of gain.

Distortion improvement achievable in practical RF amplifiers with negative feedback is typically 3 to 6 dB. As an example, if the amplifier gain is A=14 dB, feedback ratio βn=−20 dB, the open loop gain βnA will be equal to −6 dB. Assuming 0° phase shift in the feedback network, the magnitude |1+βnA| will be equal to 1.5 (or 3.5 dB). In this example, the improvement of the distortion is 3.5 dB, but at the expense of reduction of gain by the same amount of 3.5 dB (gain will drop from 14 dB to 10.5 dB). Increasing feedback coefficient βn much beyond the value in this example would quickly become prohibitive due to excessive loss of gain.

For performance improvements beyond those achievable with negative feedback in push-pull amplifiers, prior art resorts to one or more of the following methods:

Increasing linearity of amplifiers by using higher power amplifiers having higher bias (current and/or voltage) or paralleling multiple amplifiers (such as in power-doublers, where two amplifiers are wired-or to achieve better linearity). The penalty with this approach is in the increased power consumption, size and cost.

Another method to increase linearity often employed in prior art is by using linearization techniques, based either on predistortion or feed-forward methods. The predistortion method utilizes a non-linear module inserted at the input of the amplifier. This module is designed to generate distortion products precisely in anti-phase with the distortion products of the amplifier, thus canceling or reducing the distortion at the output. Another common approach, the feed-forward method, relies on extracting the distortion terms by subtracting the scaled version of the output with the input signal, inverting these distortion terms and injecting them, at the correct level and phase, at the output and thus canceling or reducing the distortion at the output. Both of these methods suffer of increased complexity and difficulties in maintaining the proper phase and amplitude matching conditions due to unit to unit component variation and over wide frequency range, as well as over varying operating conditions (temperature, power supply). In many applications, increased complexity, size and cost of these solutions are prohibitive.

Another way in prior art of improving or removing harmonic products is by way of filtering. Unfortunately this approach can't be used in many CATV devices, namely in those that must have simultaneous bandwidth covering the whole operating frequency range (e.g. distribution amplifiers passing all channels simultaneously). While filtering could be used in frequency agile applications which process one channel at the time and therefore do not need wide simultaneous bandwidth (such as up-converters, channel processors, etc.), it would nonetheless complicate the design and increase the size and cost of these devices.

In today's CATV systems, it is expected that each channel should have no less than 65 dB attenuation of distortion (and any other undesired) components. This is often difficult to achieve with the prior art solutions, particularly in applications where power consumption, physical size and cost are important, or critical considerations.

Examples of prior art systems embodying one of more of the above features are disclosed in U.S. Pat. No. 3,699,465 to Pranke; U.S. Pat. No. 5,568,089 to Maru; U.S. Pat. No. 6,211,734 to Ahn; U.S. Pat. No. 5,281,924 to Maloberti et al.; U.S. Pat. No. 3,895,306 to Rebeles; U.S. Pat. No. 4,933,644 to Fattaruso et al.; U.S. Pat. No. 5,381,112 to Rybicki et al.; and U.S. Pat. No. 5,475,323 to Harris et al. The contents of each of these U.S. patents is incorporated herein by reference in its entirety.

Thus, there is room in the art for improved push-pull amplifiers, suitable for use in agile up-converters and other CATV signal processing components in broadband multi-carrier systems and in other applications, ones that sufficiently suppress undesirable distortion components in the composite signal in order to meet and preferably exceed the distortion specification for the system, but inexpensive and easy to design and implement, and suitable for integration in radio frequency integrated circuits (RFICs), without the need for large numbers of costly switched filters and/or power hungry amplifiers.

SUMMARY OF THE INVENTION

It is one objective of the method and apparatus of the present invention to provide significant improvements over prior art in second harmonic and higher even order harmonic distortion products in push-pull amplifiers and other differential circuits, without adversely affecting the gain, in a way simple and easy to design and implement.

It is further an objective of the present invention to reduce the cost, size, complexity and power consumption of RF push-pull amplifiers required to produce the requisite RF output power with acceptable distortion levels, in broadband, multi-octave systems, having either single or multiple simultaneously present carriers.

It is yet another objective of the present invention to reduce the cost, size and power consumption of RF push-pull amplifiers with improved distortion performance in broadband multi-octave systems in a special case of processing single channel at a time.

It is further an objective of the present invention to provide significant improvement over prior art in the balance of the fundamental signals (and odd order distortion terms) in push-pull amplifiers and other differential structures.

It is another objective to embody the present invention in a form suitable for integration on a single chip RF integrated circuit (RFIC), with minimum required support circuitry.

The method of the present invention is particularly suited for use in broadband, push-pull devices used in cable TV's distribution amplifiers and channel up-converters, but also in high speed digital, GHz range differential, clock drives requiring very good balance and duty cycle, and in other applications, employs a common-mode feedback or a common-mode feed-forward technique, which selectively extracts, acts upon and reduces distortion terms only, without affecting fundamental signals.

In accordance with the present invention, the foregoing and other objectives are achieved by the means of a feedback, herein referred to as common-mode feedback, and/or feed-forward) herein referred to as common-mode feed-forward, which will be clear to those of skill in the art in view of the detailed description of the invention.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE INVENTION

Figure 1A:
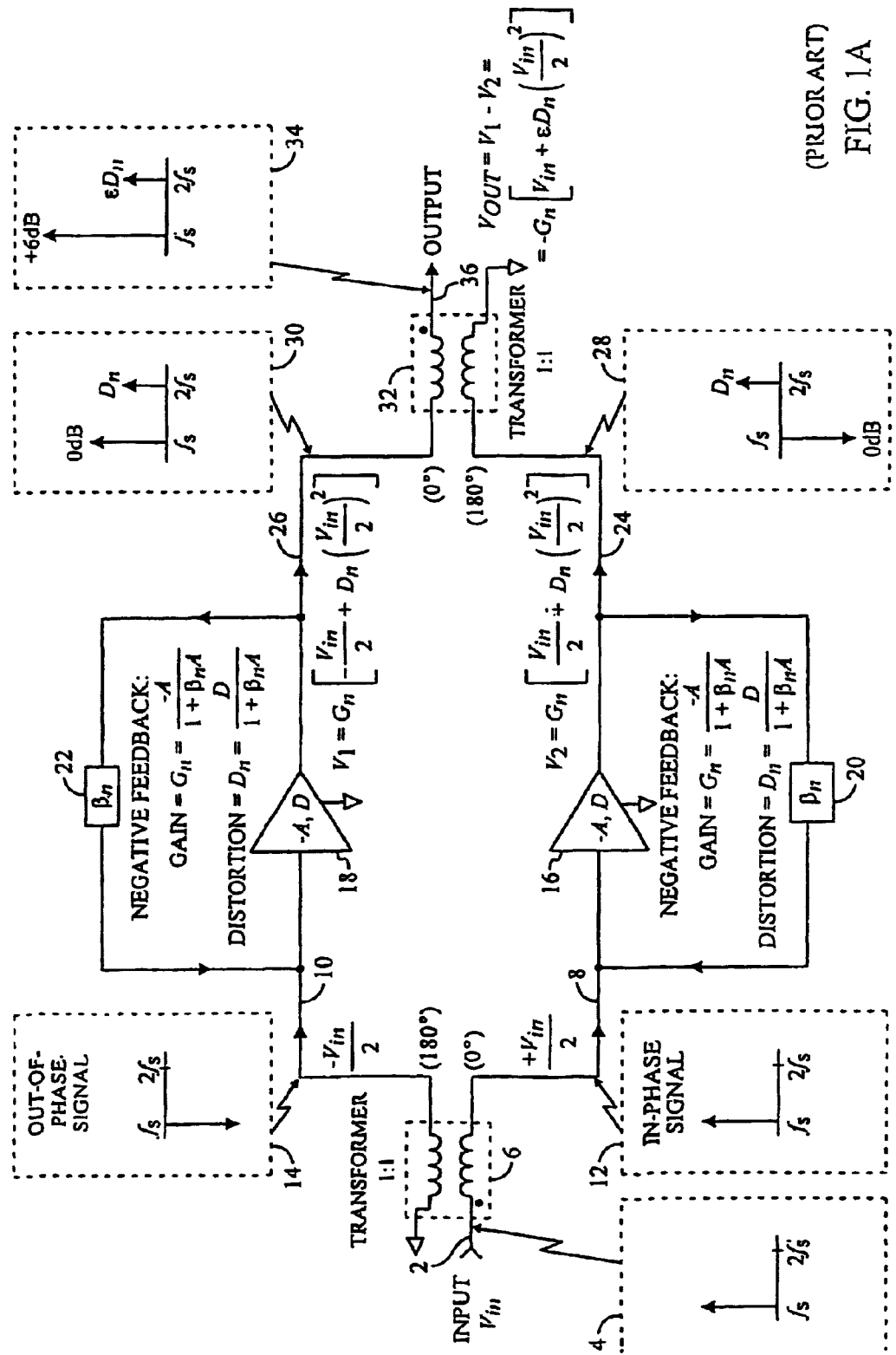
FIG. 1A is a conceptual representation of a prior art push-pull amplifier with negative feedback in each arm.
Figure 1B:
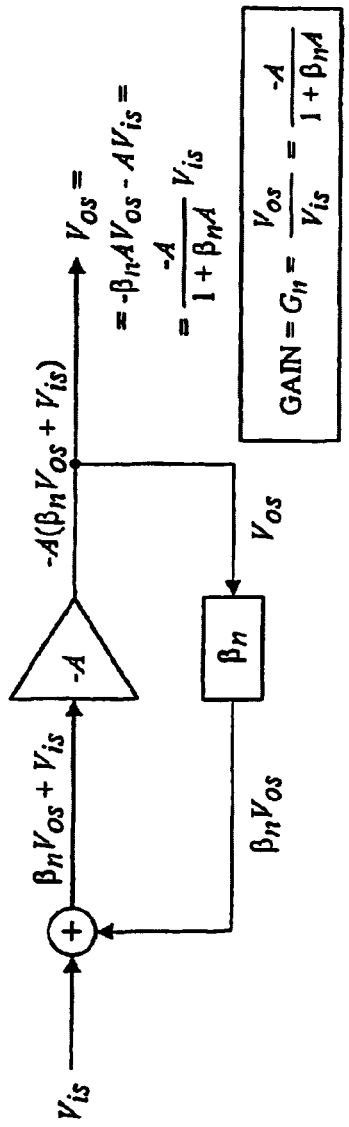
FIG. 1B is a block diagram of a single ended inverting amplifier with negative feedback used in each arm of the prior art circuit of FIG. 1A, used herein to derive a closed loop gain expression.
Figure 1C:
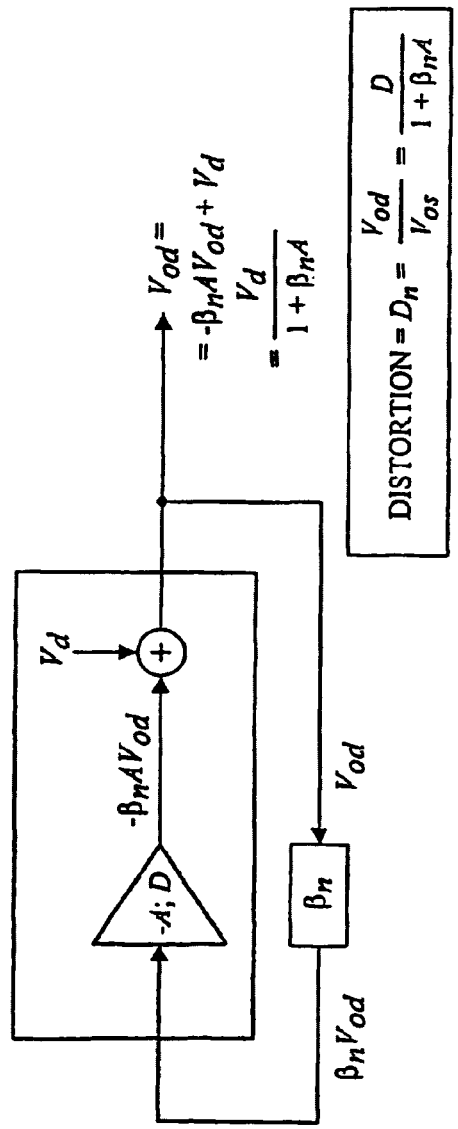
FIG. 1C is a block diagram of a single-ended inverting amplifier with negative feedback used in each arm of the prior art circuit of FIG. 1A, used herein to derive a closed loop expression for distortion improvement due to negative feedback.

The main difference between the present invention and the prior art is in the feedback topology, and consequently, in the spectral content of the feedback signal. While the negative feedback of the prior art (FIG. 1A) contains strong fundamental signal in the feedback path, the common-mode feedback of the present invention (FIG. 2A) contains no fundamental signal energy. The present invention accomplishes distortion improvements, and other goals, such as improvements in the signal balance, by employing a feedback herein referred to as common-mode (CM) feedback. The CM feedback is essentially a selective negative feedback, acting upon even order distortion terms only. It does not affect the desired fundamental signals (nor it affects odd order distortion terms), thus accomplishing improvements of even order distortions without any loss of signal gain.

The CM feedback signal is easily generated by simple summation of signals in the two push-pull arms (hence the term "common-mode", since it is obtained by addition of otherwise differential signals). It will be shown that the common-mode feedback of the present invention can be orders of magnitude stronger than the traditional negative feedback, thus significantly reducing second and higher even order distortion products, while not causing any reduction of signal gain.

While the CM feedback is a preferred approach in the present invention, an alternative solution using common-mode feed-forward technique is also herein disclosed.

Figure 2A:
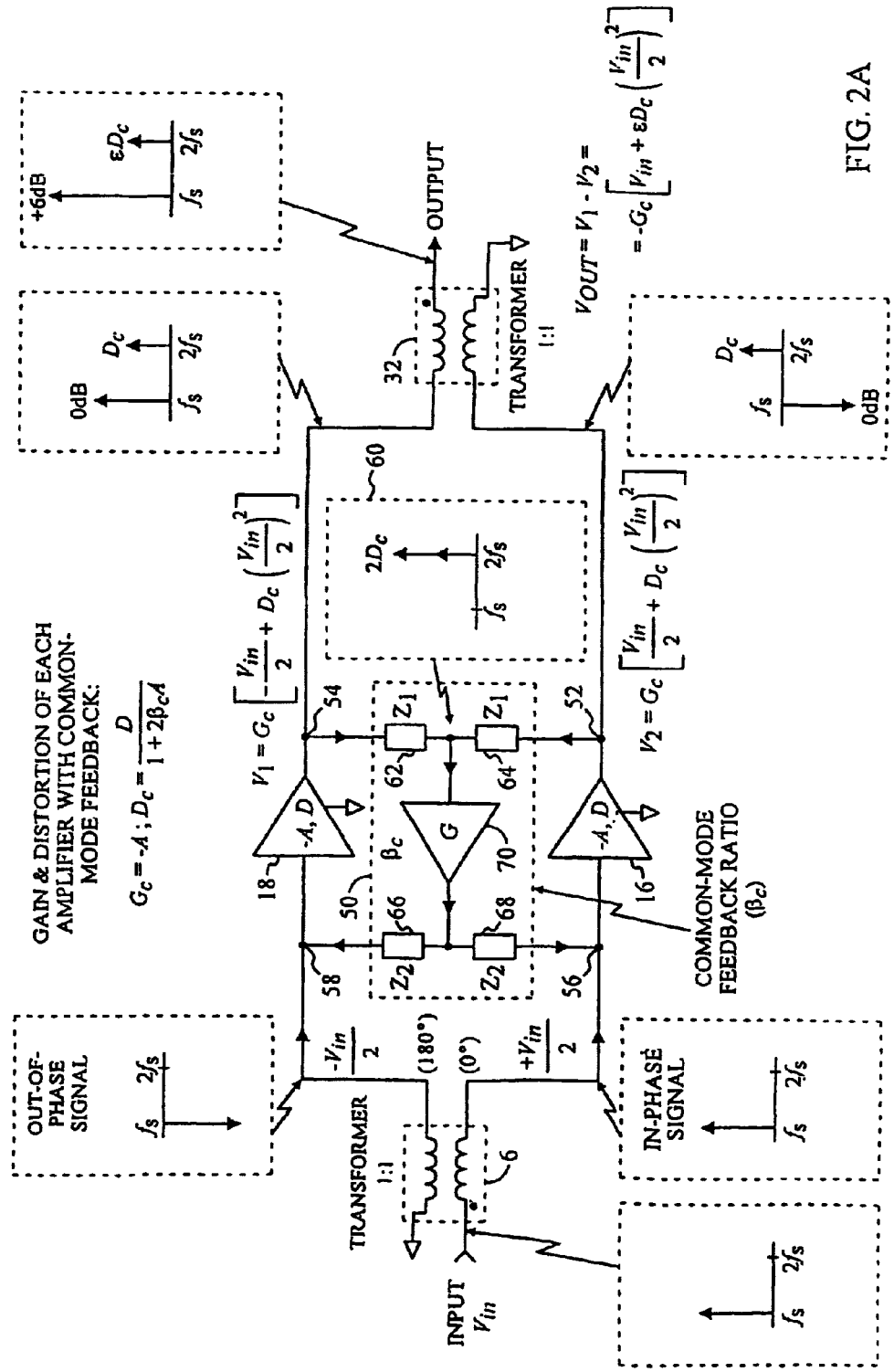
FIG. 2A is a conceptual representation of a push-pull amplifier utilizing, common-mode feedback for even order distortion improvements of the present invention.

The method and apparatus of the present invention is now described. FIG. 2A is a conceptual re presentation of a push-pull amplifier utilizing common-mode feedback of the present invention. The principle of operation is based on the fact that the two complementary fundamental signals' at amplifiers outputs 52 and 54 are out of phase with one another and second harmonic and higher even order terms signals are in phase with each other at the outputs of the two amplifiers. Even order terms are in phase with each other, because they are generated by the even order non-linearity of the amplifier, and therefore they are proportional to the fundamental signal raised to the even order exponent. Raising to the even order power the negative sign disappears, and the result is the same (positive) sign, i.e. the same phase, in the two arms. Thus, summing the two signals will produce the sum of even harmonic terms and will cancel the fundamental (and all odd order distortion terms) in the summation junction 60, thus providing a correction signal that can be advantageously used for reduction of distortion terms, by injecting this signal, with proper level and phase, into suitable nodes.

For feedback, the correction signal is injected at the input of the amplifiers, and for feed-forward, it is injected at the output.

The feedback signal in FIG. 2A is obtained by summation of the two amplifier output signals 52 and 54 in circuit block 50. The summation is accomplished via coupling impedances 62 and 64, providing the sum signal at the common node 60. This signal, after phase and amplitude conditioning in block 50, is passed back to amplifier inputs via feedback lines 56 and 58. The reinsertion of the CM feedback signal into amplifier inputs is accomplished via impedances 66 and 68. Due to circuit symmetry, the output coupling impedance 62 is nominally equal to 64 (Z1). Similarly the input coupling impedance 66 is nominally equal to 68 (Z2). However, in some cases making these impedances, unequal may be advantageous, as discussed later in more details.

It is important to emphasize that the CM feedback is a form of negative feedback, requiring a total of 180° phase shift around the loop. Since the main amplifiers 16 and 18 are inverters (already inducing 180° phase shift), the phase shift required by the rest of the loop (i.e. by the feedback network) must be 0°.

The level and phase of the CM feedback signal directly depends on the argument and magnitude of complex impedances Z1 and Z2, and clearly the design choices of these parameters can be used to control the loop behavior to large extent. It should be noted that Z1 and Z2 will necessarily cause additional impedance loading at output and input amplifier's terminals, thus affecting the input and output return loss of the push-pull circuit. This effect must also be considered in the design.

To increase the level of the feedback correction signal, amplifier 70 can be used, i.e. an active feedback with gain can be employed. Ability to use active feedback and so obtain significant increase of the loop gain presents one of the key advantages of the present invention. This amplifier can be of a low power, low dynamic range type (thus not burdening the power dissipation/consumption budget) because the signal levels it processes are small, residual distortion terms. This amplifier should be of a non-inverting type (nominal 0° phase shift) in order to maintain necessary conditions for negative feedback and stability in the loop.

In summary, the design choices of impedances Z1 and Z2, as well as the choice of main amplifiers 16 and 18 and feedback amplifier 70 must be made based on the loop performance consideration, circuit stability, as well as impedance matching conditions presented at the input and output ports.

It should also be mentioned that with push-pull and other differential circuits, there is an opportunity to take advantage of systematic circuit imbalances, if any, and the design practice should include such considerations. As an example; balun transformers employed in push-pull applications usually have some systematic imbalances, often caused by inherent asymmetry in their construction. In this case, it is beneficial to connect the terminals of the input and output baluns in a specific way, one that would provide cancellation effects for such asymmetry. An example is shown in FIG. 2A, where a "diagonal symmetry " of the input/output connections is utilized, i.e. the input signal is applied to a terminal designated with a dot in balun 6, and the output is extracted from the equivalent terminal with a dot in output balun 32. This is a preferred orientation of baluns, because the sense of the errors caused by the imbalance will be opposite in the two baluns, providing first order cancellation of the imbalance effects.

As those skilled in the art can appreciate, the use of a common mode feedback signal formed at a common node between two impedances each connected respectively to the output of each active device, wherein the value of such impedances can be selected at will, provides a degree of adjustment freedom independent of the construction of the windings of the output balun and thus provides a particular advantage over prior art circuits in which a common mode feedback node is formed by a center tap in the primary winding of an otherwise more complicated output balun.

For better insight into relationships of various factors affecting circuit operation, some analytical treatment of the more important parameters of the present invention is provided 5 below.

Figure 2B:
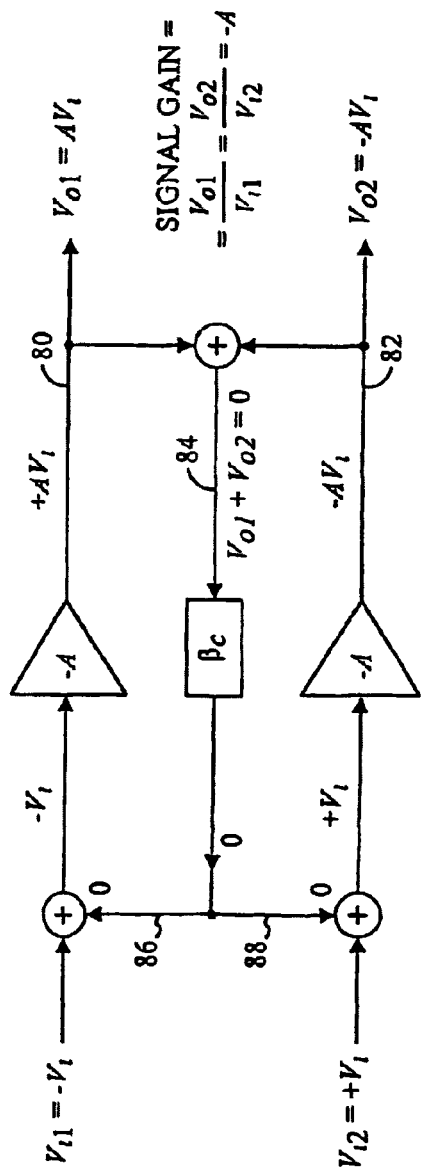
FIG. 2B is a simplified block diagram of a push-pull amplifier with common-mode feedback of the present invention of FIG. 2A, used herein to derive a closed loop gain expression.

Equation for signal gain of the push-pull amplifier with common-mode feedback can be derived by inspection of FIG. 2B. Two complementary output signals 80 and 82, having equal magnitudes and opposite signs, are summed, yielding zero value of signal 84. Consequently, feedback signals 86 and 88 also have zero value, having no contribution at the inputs of the two amplifiers. Therefore, the gain in each arm remains unaffected by the common-mode feedback and remains equal to the open loop gain of the amplifiers:

$$\text{Signal Gain (with CM FB)} = G_c = \frac{V_{01}}{V_{i1}} = \frac{V_{02}}{V_{i2}} = -A \tag{8}$$

It is evident from eq. (8) that there is no loss of gain due to common-mode feedback. This feature represents another key advantage of the present invention. The reason the gain is not lost is essentially due to a fact that desired fundamental signal is non-existent in the feedback loop, because it is canceled in the common mode summation junction, by virtue of out-of-phase signal conditions. The cancellation of the complementary fundamental signals in the feedback loop effectively cuts off the feedback, since there is no signal to communicate back through the loop. This is entirely true only if the balance is perfect. In reality, there will be some circuit imbalances, causing a small amount of fundamental signal to appear in the loop. However, as shown below, the imbalance effects are negligible and gain remains substantially unaffected by the common-mode feedback.

Figure 2C:
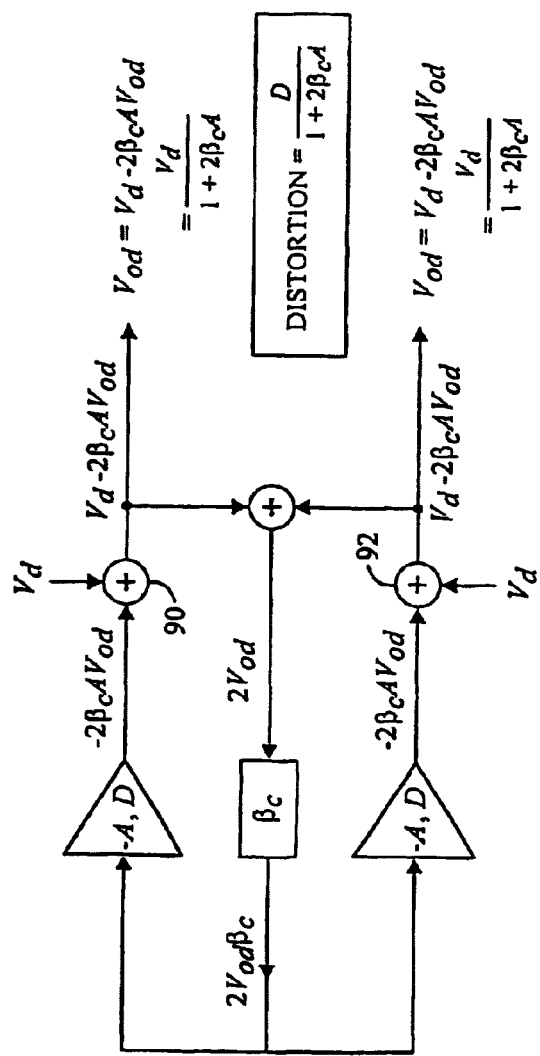
FIG. 2C is a simplified block diagram of a push-pull amplifier with common-mode feedback of the present invention of FIG. 2A, used herein to derive a closed loop expression for distortion improvements due to common-mode feedback.
Figure 2D:
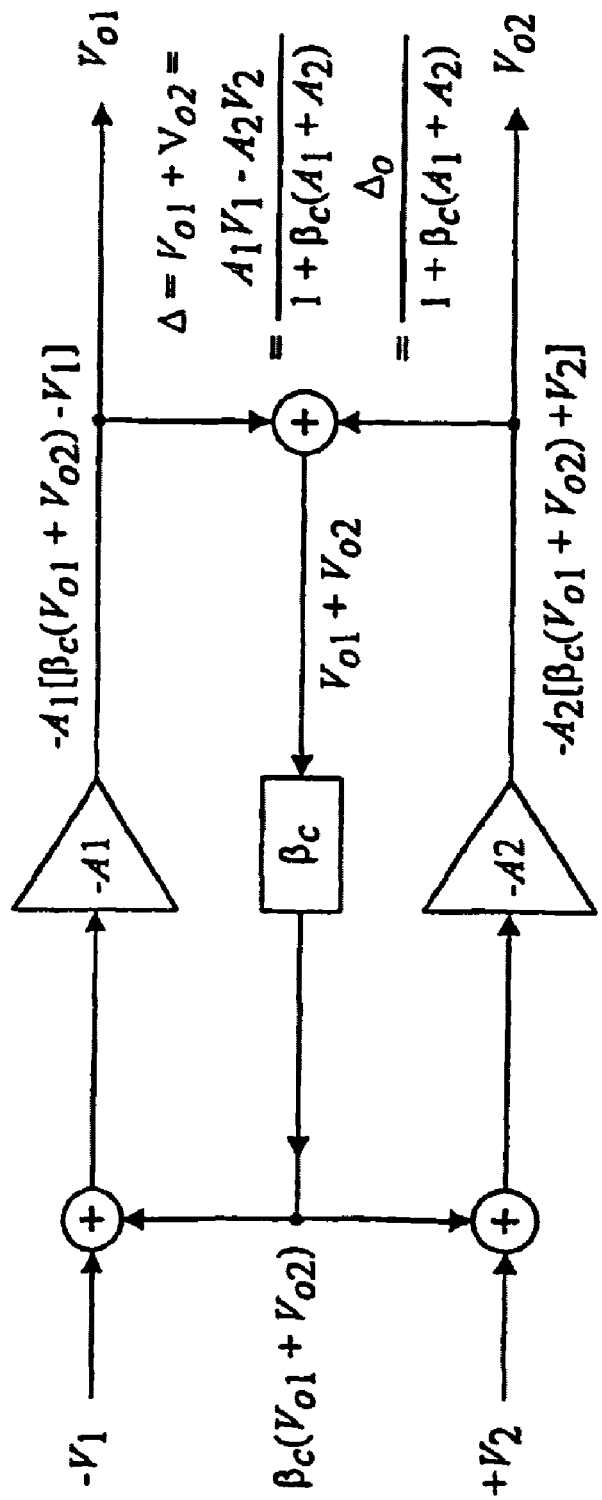
FIG. 2D is a simplified block diagram of a push-pull amplifier with common-mode feedback of the present invention of FIG. 2A, used herein to derive a closed loop expression for imbalance improvements due to common-mode feedback.

With reference to FIG. 2D, accounting for input signals imbalance and amplifiers gain imbalance, the output signals are computed per equations below:

$$V_{01} = A_1 V_1 - \frac{\beta_c A_1 \Delta_0}{1 + \beta_c (A_1 + A_2)} \approx A_1 V_1 - \frac{\Delta_0}{2}, \text{ for } \beta_c(A_1 + A_2) \gg 1 \tag{8a}$$

$$V_{02} = -A_2 V_2 - \frac{\beta_c A_2 \Delta_0}{1 + \beta_c (A_1 + A_2)} \approx -A_2 V_2 - \frac{\Delta_0}{2}, \tag{8b}$$

$$\text{for } \beta_c(A_1 + A_2) \gg 1$$

where: V1 and V2 are input signals, A1 and A2 gain of respective amplifiers The term $\Delta_0$ in the above equations represents the imbalance of the amplifier outputs without any feedback, and is defined as the sum of the output voltages relative to ground potential, per the following equation:

$$\Delta_0 = A_1 V_1 - A_2 V_2 \tag{8c}$$

Note: $\Delta_0$ is similar to previously defined imbalance quantity $\epsilon$ in equation (1), except that $\epsilon$ represents the total imbalance of the entire push-pull circuit (including output balun and other factors), while $\Delta_0$ represents the imbalance of the input signals and amplifiers gain only. Perfect balance would result in zero sum for $\Delta_0$; any non zero result is a measure of difference, or imbalance, of the two voltages in respect to ground.

Examining equations (8a) and (8b), for small imbalance $\Delta_0$ (which is necessarily the case in practice, otherwise the benefit of the push-pull topology would be defied), it can be found that only small gain perturbations are caused by this term for any value of $\beta c$ for which the circuit is stable. For a likely practical case of large open loop gain [$\beta c(A_1+A_2)$ >>1], when the feedback coefficient $\beta c$ disappears from the equation, the common-mode feedback effect on gain is completely negligible.

The distortion of the push-pull amplifier with common-mode feedback can be computed using FIG. 2C. Here, even order distortion signals 90 and 92 are in-phase with each other. Assuming identical amplifiers, distortion magnitudes will be the same (designated as distortion voltage Vd). After some manipulation, the following equation can be derived:

$$\text{Output Distortion (with CM FB)} = \tag{9}$$

$$D_c = \frac{Vod}{Vos} = \frac{Vd}{Vos} \frac{1}{1 + 2\beta_c A} = \frac{D}{1 + 2\beta_c A}$$

where $\beta c$ is the common-mode feedback ratio coefficient and $(-A)$ is the amplifier gain.

From eq. (9) it follows that the distortion improvement with the common-mode feedback is equal to the magnitude of the denominator, i.e. $|1+2\beta_c A|$. Clearly, increasing the magnitude of the denominator, better distortion improvements can be achieved.

It should be emphasized that only distortions generated inside the (push-pull) circuit are the subject of improvements—the distortions that may be coming along with the signal from the source are not. This is clearly the case because the incoming distortions are indistinguishable from the signal, since, much like the signal itself, they will be complementary to each other and will not contribute to the content of the collection signal in the feedback.

However, the above is not true for the improvements of signal balance—it will be shown later that regarding signal balance improvements, the CM feedback not only improves the imbalance caused by the circuit (push-pull) itself, but that it also improves the imbalance of the incoming signal (if any) from the source! Also, it will be shown that there is an indirect distortion improvement due to the benefits of improved signal balance. Returning back to FIG. 2A, the output of the push-pull amplifier with common-mode feedback can be expressed:

$$Vout = G_c \cdot \left[Vin + \varepsilon_c \cdot D_c \left(\frac{Vin}{2}\right)^2\right] \tag{10}$$

where:
Vout=output signal voltage
Vin=input signal voltage
Gc=gain of each arm with common-mode feedback, per eq. (8)
Dc=second order distortion in each arm with common-mode feedback, per eq. (9)
$\epsilon_c$=total imbalance (with common-mode feedback) between the two arms Substituting eq. (8) and (9) in eq. (10), the effects of the common-mode feedback can be expressed in a consolidated equation for the output signal of the push-pull:

$$Vout \text{ (with CM FB)} = -A \cdot \left[Vin + \varepsilon_c \frac{D}{(1 + 2\beta_c A)}\left(\frac{Vin}{2}\right)^2\right] \tag{11}$$

Figure 4:
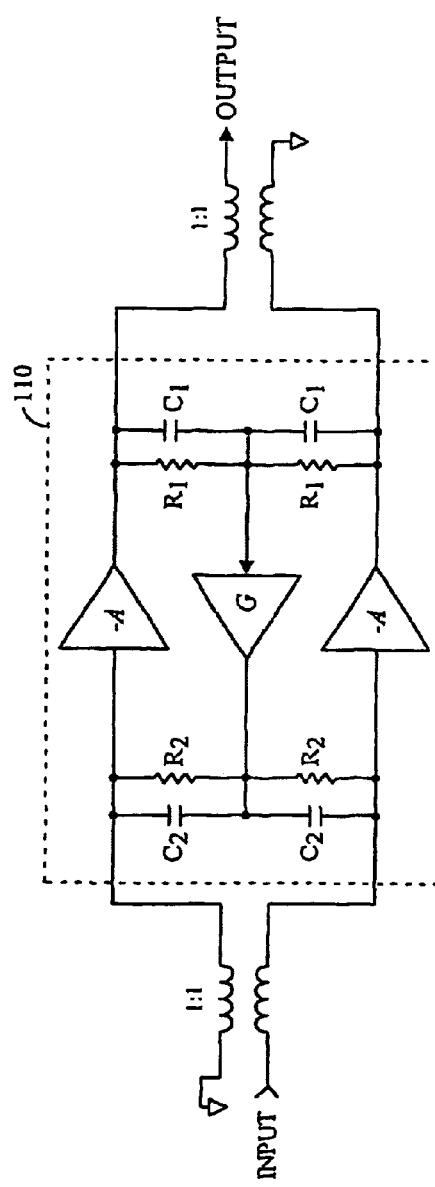
FIG. 4 is a simplified block diagram of another preferred embodiment of a push-pull amplifier utilizing active circuit implementation of a common-mode feedback of the present invention.

The expression for distortion with common-mode feedback per eq. (11) is similar to that for the negative feedback of eq. (7). However, the main difference is in the extent of attainable magnitude of the denominators in each of the two equations. The magnitude of denominator $|1+2\beta_c A|$ in eq. (11) can be designed to achieve much greater values than the magnitude of denominator $|1+\beta_n A|$ in eq. (7). Greater value with common mode feedback is possible because circuit and implementation constraints do not limit the maximum value of $\beta c$, not nearly as much as they limit the maximum value of $\beta n$ in the case of negative feedback. The main reason for this is that there is no loss of gain with CM feedback, and therefore the gain places no limit on the magnitude of $\beta c$, unlike in the case of $\beta n$. In fact, $\beta c$ can be greater than 0 dB (i.e. it can have an active amplifier with gain in a feedback path, as depicted in FIG. 4), which is not possible with negative feedback. The only limitation of the value of $\beta c$ is due to possible instabilities or oscillations in the loop, as previously mentioned, which can occur if the phase margin of the open loop gain $\beta c A$ is not sufficient.

It is in the fact that the magnitude of $\beta c$ can be much greater than the magnitude of $\beta n$ where the principal advantage of the present invention over prior art is. The effect of the difference in magnitudes of these coefficients on the distortion improvements, as well as the resulting significant advantage of the common-mode feedback over prior art is demonstrated in Table 1 below.

Theoretical improvement of second order distortion achievable with common-mode feedback is compared with that of negative feedback in Table 1 for an example of a push-pull amplifier using amplifiers having a gain of A=15 dB and assuming ideal case of 0° phase shift of the open loop gain in both negative and common-mode feedback case:

TABLE 1

Comparison of Common-Mode Feedback and Negative Feedback in the case of a 15 dB gain amplifier

| Feedback Ratio: $\beta n$ or $\beta c$ (dB) | Open Loop Gain: $\beta n A$ or $\beta c A$ (dB) | Theoretical distortion improvement with Negative Feedback = $|1 + \beta n A|$ (Note: signal gain is reduced for the same amount) (dB) | Theoretical distortion improvement with Common-Mode Feedback = $|1 + 2 \beta c A|$ (Note: no reduction of signal gain) (dB) |
|---|---|---|---|
| −25 | −10 | 2.4 | 4.3 |
| −20 | −5 | 3.9 | 6.5 |
| −15 | 0 | 6.0 | 9.5 |
| −10 | 5 | Not applicable due to excessive loss of gain (8.9 dB) | 13.2 |
| −5 | 10 | Not applicable due to excessive loss of gain (12.4) | 17.3 |
| 0 | 15 | Not applicable due to excessive loss of gain (16.4) | 21.8 |
| 5 | 20 | Not applicable due to excessive loss of gain (20.8) | 26.4 |
| 10 | 25 | Not applicable due to excessive loss of gain (25.5) | 31.3 |
| 15 | 30 | Not applicable due to excessive loss of gain (30.0) | 36.2 |

As shown in Table 1, the improvements with common-mode feedback, using active gain in the feedback path, can be dramatic. With feedback ratio of +10 dB (using active gain in the loop), distortion improvement as high as 30 dB or more may be achievable. Such improvements are not possible with negative feedback.

In practice, implementation losses will limit the amount of achievable improvements with common-mode feedback. As previously mentioned, principal limitation is related to circuit stability, which in turn depends on the phase margin of the open loop gain $\beta c A$. This seems contrary to the implications of eq. (8), which states that the signal gain is independent of the loop gain $\beta c A$, leading one to conclude that the stability should not be affected by the loop gain. However, this is not true, because eq. (8) applies to the rain from input to output of the push-pull structure, whereas the stability is related to a single-ended loop gain around each of the amplifiers (the single-ended loop gain around each amplifier is a gain of a signal inserted in one amplifier only, without a complementary signal inserted in the other amplifier in the push-pull circuit—it is equivalent to each amplifier's noise gain around the loop, which is the one relevant for circuit stability considerations). It can be shown that the single-ended gain (and therefore the stability) does depend on the loop gain $\beta c A$, with a similar expression to that in equation (9).

To ensure circuit stability, the phase margin of open loop gain. $\beta c A$ must meet stability criteria—a minimum of 60° or more, depending on each specific circuit case: Failure to meet and maintain the minimum margin can give rise to positive feedback and potentially cause oscillations. This is because with insufficient: phase margin, the term $1+2\beta cA$ can approach zero and the condition for oscillations can occur, causing instability, degraded distortion performance, and potentially producing parasitic oscillations. It should be noted that for stability purposes, the phase margin needs to be maintained at sufficient levels only at frequencies where the loop gain is greater than 0 dB. At frequencies where the loop gain is lower than 0 dB, the circuit can't oscillate, and therefore the phase margin is not important. This can be advantageously utilized by designing a frequency-discriminating feedback network for best phase margin and gain in the frequency band of interest, and attenuating the feedback at out of band frequencies to below 0 dB gain, thus ensuring stability at both in-band and out of band frequencies. In most amplifiers and other devices, the phase margin will progressively degrade at higher frequencies, because the effect of parasitic inductances and capacitances on the phase shift is proportional with frequency. As an example, in a broadband, multi-octave amplifier operating from 50 MHz to 1 GHz due to increased phase shift at higher frequencies, the instability can occur much above 1 GHz, where the loop gain can still be substantially above 0 dB. In this case, a low pass filter can be utilized in the feedback circuit, designed to attenuate the feedback gain to below 0 dB at frequencies above 1 GHz. Unfortunately, along with desired attenuation, the filter will necessarily cause undesired phase shift, which may in fact degrade the circuit stability, unless it's phase and amplitude response is carefully optimized for the application circuit. The adverse phase shift effect may limit the applicability of this method.

Another side benefit brought in by CM feedback, beyond distortion improvements, is the improvement in the balance of the fundamental signals (as well as the balance of the odd-order distortion terms) in the two arms of the push-pull circuit, as discussed below. This benefit is not available with negative feedback of the prior art.

The balance improvement with CM feedback (in respect to signal ground) can be computed with the help of FIG. 2D by simply summing up the voltages at the two outputs, earlier derived in equations (8a) and (8b):

$$\text{Output Balance} = V_{01} + V_{02} = \frac{A_1 V_1 - A_2 V_2}{1 + \beta_c(A_1 + A_2)} = \frac{\Delta_0}{1 + \beta_c(A_1 + A_2)} \quad (12)$$

Equation (12) shows that by the CM feedback, the signal imbalance improves by the factor equal to the denominator in this equation, i.e. the imbalance of the amplifier outputs without the feedback ($A_0$) gets reduced thanks to the feedback by the magnitude of the denominator. For example, if the imbalance between amplifier outputs is 1 dB without a feedback and the open loop gain $\beta c(A_1+A_2)$ is 12 dB, then the magnitude of $|1+\beta c(A_1+A_2)|$ would be about 14 dB, i.e. a factor of 5, resulting in the imbalance reduction by the same factor. This translates to a reduction of the initial 1 dB imbalance to less than 0.2 dB residual imbalance.

Essentially, with CM feedback the imbalance between the two arms is reduced by the amount equal to the distortion improvement. This improved balance will, in turn, provide one significant, collateral benefit, and that is the additional improvement of even order distortion, beyond the one described so far. The reason is that improved balance of fundamental frequency signals results in improved balance of the distortion terms generated at the amplifiers outputs (because distortion terms are proportional to the fundamental signal raised to an exponent), which in turn improves the depth of cancellation provided by the output balun.

The CM feedback not only improves the imbalance caused by the (push-pull) circuit itself, but it also improves the imbalance of the incoming signal (if any) from the source. This can be verified by inspecting a nominator of eq. (12)—it contains the combination of both input signal levels and gain terms of the two amplifiers. Thus, not only the imbalance of the gain A1 and A2, but also any imbalance that may exist in the incoming source signals V1 and V2 will be improved by the common-mode feedback.

The balance-improving feature of CM feedback can be advantageously used in many applications, where the balance of differential signals in respect to ground is important. An application example can include improvements in the balance of differential high-speed (GHz range) clocks, Where signal balance may be important for timing recovery. The even order distortion improvements can also be beneficial in this application, since it would improve the duty cycle of the clock signals, thus further improving clock symmetry and precision of timing recovery. Another example may be in differential line drivers and similar applications.

Returning back to common-mode feedback design considerations, a few additional aspects are discussed next.

The impedance matching conditions at the input and output terminals may have some impact on the common-mode feedback. The effect caused by impedance mismatch at input or output terminals will depend on the amount of reflections that may exist at these terminals. This effect is limited to the extent of the magnitude of the reflection coefficient. It can be shown that the open loop gain $\beta cA$ will be multiplied by a factor of $(1+\rho)$, where $\rho$ is a complex number representing reflection coefficient at either input or output poi. With good matching conditions, the reflection coefficient will be in the order of 0.1 (20 dB return loss) and this effect will be negligible. In cases where the matching is worse, e.g. with reflection coefficient greater than about 0.3 (10 dB return loss), reflections can affect the magnitude of the common-mode-feedback, and may need to be accounted for and addressed by optimizing, the feedback ratio $\beta c$.

Another aspect important to note in the case of active common-mode feedback is noise. It is not difficult to see that high noise level will exist at the output of the active feedback amplifier, because this noise is the amplified input noise of the feedback amplifier. As an example, if the gain is of the feedback amplifier is 20 dB and noise FIG. 3 dB, and coupling loss 10 dB, the injected noise level will be 20+3−10=13 dB (above thermal noise-floor of −174 dBm/Hz). This injected noise effectively degrades the noise figure of each amp by the same amount. Fortunately, this noise will cause no harm in the system, because it will be completely canceled at the output port. The reason is that the noise is injected into each amplifier input as a common-mode signal, having the same phase in both arms, i.e. zero relative phase. After amplification, since both amplifiers have the same phase shift (i.e. both have phase inversion), the zero relative phase condition will be preserved and the noise will be subsequently canceled in the output balun (which performs the operation of subtraction). As a result, there is no noise figure degradation or noise level increase caused by the common-mode feedback.

The common-mode feedback and negative feedback can co-exist simultaneously in the same circuit. By adding negative feedback line from output to input of each of the amplifiers (not shown in FIG. 2A) in addition to the common-mode feedback, a combined feedback can be obtained. The gain will now be controlled by the negative feedback and it will be reduced by a factor of $(1+\beta nA)$—as in the case with negative feedback alone—while the distortion will be reduced by a greater (combined) factor, equal to $[1+(\beta n+2\beta c)A]$. The combination of the two feedbacks can provide additional flexibility and degree of freedom in design choices.

Figure 3:
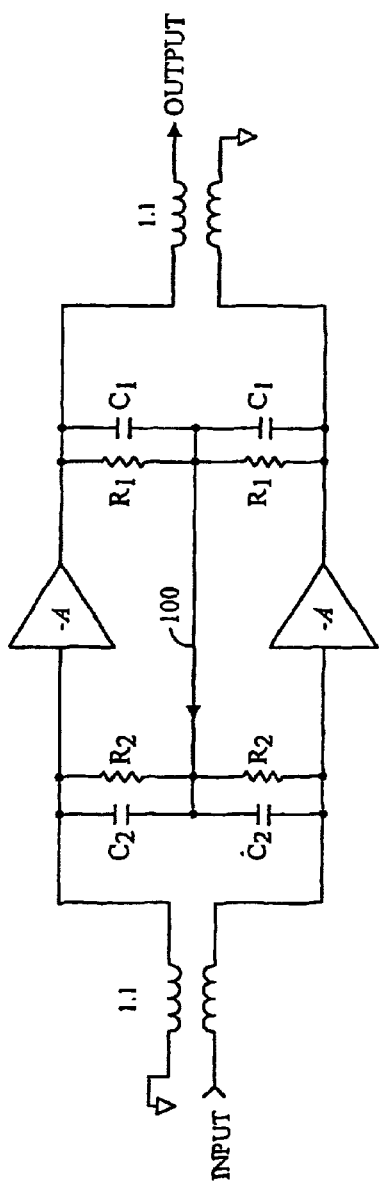
FIG. 3 is a simplified block diagram of one preferred embodiment of a push-pull amplifier of the present invention, utilizing a simple passive circuit implementation for common-mode feedback.

One preferred embodiment of a push-pull amplifier of the present invention utilizing a simple passive circuit implementation of the common-mode feedback is illustrated in FIG. 3. The common-mode feedback is obtained by passive network, consisting of a combination of resistive and capacitive components R1 and C1 for feedback signal extraction, and the combination of R2 and C2 components for feedback signal insertion. Resistive components determine the magnitude, while capacitive components help reduce phase delays at higher frequencies. This embodiment is suitable for discrete implementation, since the feedback network is simple and has low component count. To facilitate the design process, it is beneficial to open the loop at the common-mode feedback point 100. Breaking the loop at this point will allow for simulation, optimization, and eventual measurements of the open loop gain and phase. Thanks to the low component count and lack of active elements in the feedback path, the loop performance is more predictable and circuit stability is easier to achieve and maintain. The downside of the passive feedback is in the lower achievable loop gain magnitudes, and therefore in limited potential for distortion improvements. In practice, due to circuit loading and losses in the feedback network, the maximum achievable open loop gain $\beta cA$ is in the order of 0 dB, limiting the distortion improvements to no more than about 9 dB. However, even with this limitation, it is still much more effective than the negative feedback.

In FIG. 4, a simplified block diagram of another preferred embodiment of a push-pull amplifier utilizing active circuit implementation of a common mode feedback of the present invention. This embodiment is particularly suitable for integration. The entire block 110, including main amplifiers, feedback amplifier and all passive components can be integrated in a monolithic RF integrated circuit. With integration of the entire CM feedback network, much better open loop phase margin, and therefore better loop stability can be obtained, which would in turn allow realization of much greater open loop gain magnitude. The integration provides this advantage because there is no phase delay of the feedback signal caused by exiting/entering the IC package, since the adverse effects of parasitic package impedances, such as bond wire inductance and pin inductance and capacitance on phase delay are avoided. With no phase delay caused by package, it is much easier to achieve desired loop phase over broad frequency range. Another advantage of the integrated solution is in flexibility to use non-inverting main amplifiers instead of inverting amplifiers, should that be a preferred design choice (for instance, if more gain is needed, two cascaded inverting amplifiers can be used), in which case the phase inversion necessary for proper operation can be provided by the feedback amplifier.

With active feedback, open loop gain in the order of 25 dB should be easily achievable, yielding potentially over 30 dB of distortion improvements. However, with high loop gain the risk of circuit instability is higher, and extra caution should be exercised as to the effects of external circuits to the phase margin and overall circuit stability.

Figure 5:
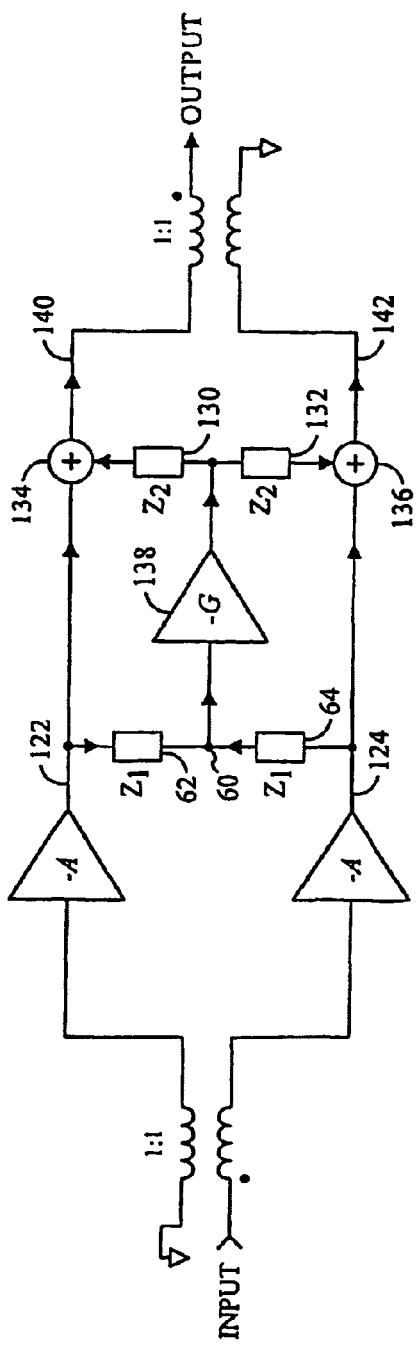
FIG. 5 is a conceptual block diagram of one representation of a push-pull amplifier utilizing common-mode feed-forward techniques with correction signals injected at the output of amplifiers, for second order distortion improvement of the present invention.

A conceptual embodiment of feed-forward method of the present invention is illustrated in FIG. 5. The common-mode correction signal 60 is obtained in the same way as for the feedback application, by summation of amplifiers outputs 122 and 124 via impedances 62 and 64 (Z1). The CM correction signal 60, for the same reasons previously described, contains even distortion signals only. Next, this signal is amplified in amplifier 138, split in two with the help of impedances 130 and 132 (Z2) and then injected by the means of combiners (or directional couplers) 134 and 136 into each of the arms at the output of the amplifiers. The injected CM correction signals must be out of phase with signals in the main line, and therefore amplifier 138 must be of inverting type. This way, a negative feedback loop around this amplifier is effectively formed. It can be shown that the gain, balance and distortions of this loop are governed by equations similar to (8), (8a), (8b) and (9), and that the feed-forward technique essentially offers similar overall improvements as the CM feedback, however, with the following disadvantages: more gain (G) in the feed-forward CM path is needed (because the benefit of the main amplifier gain A is not utilized, and also due to higher attenuation in coupling impedances Z1 and Z2 caused by higher impedance levels of these components, necessary in order to reduce output loading and maintain required output return loss); some loss of the main signals in combiners 134 and 136 due to insertion/combination loss of these devices will occur, requiring higher level at the output of the main amplifiers, thus placing additional burden on their signal level handling capabilities. On the positive side, one advantage of the CM feed-forward technique is in that the phase margin and stability are easier to achieve, and that's because only one active element is involved in the loop. Noise injection is not a problem, since like with CM feedback, noise gets canceled in the output balun.

Figure 7:
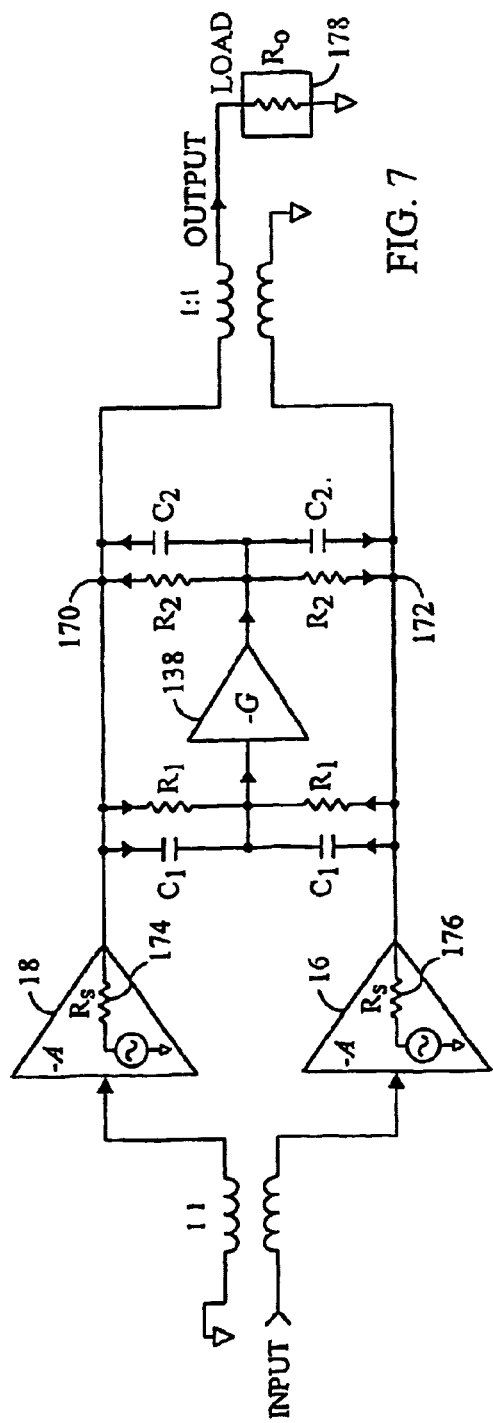
FIG. 7 is a block diagram of one preferred embodiment of a push-pull amplifier utilizing common-mode feed-forward technique, with correction signals directly injected at the output of amplifiers, for second order distortion improvement of the present invention.

One embodiment of feed-forward method of the present invention is illustrated in FIG. 7. The common-mode correction signal is obtained by summation of amplifiers outputs via R1/C1 components. After amplification in 138, injection is accomplished simply via direct connection of R2/C2 to the output lines 170 and 172, by way of forming a voltage divider with amplifier source impedance 174 (Rs) and transformed load impedance 178 (Ro).

Capacitors C1 and C2 are used to provide phase advance for higher frequencies and help maintain desired phase around the loop.

Figure 6:
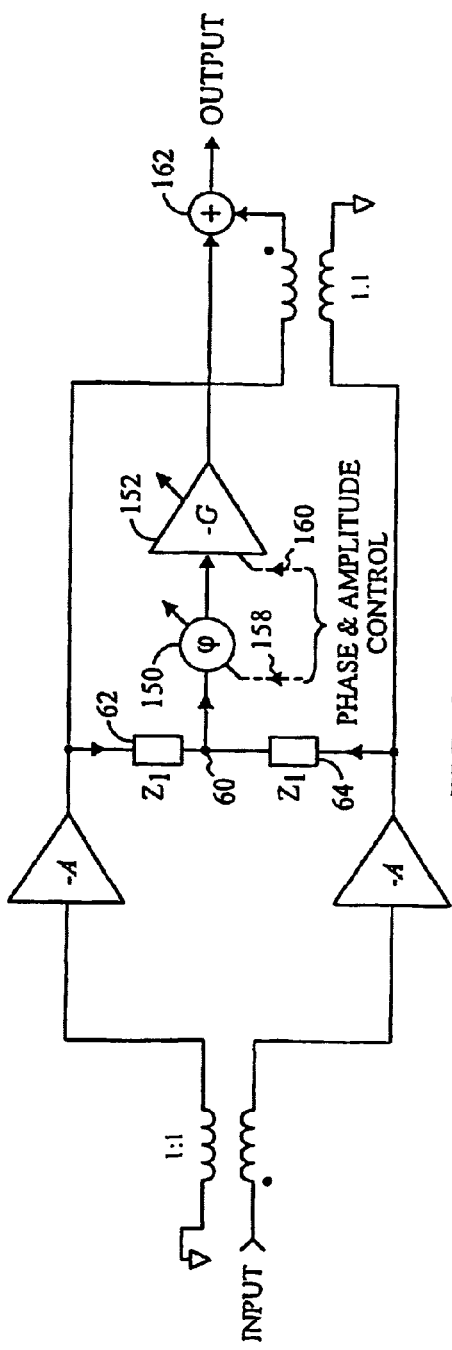
FIG. 6 is a conceptual block diagram of another representation of a push-pull amplifier utilizing, common-mode feed-forward technique, with phase and amplitude adjustments and injection of correction signals at the output of the balun, for second order distortion improvement of the present invention.

Another possible embodiment, utilizing common-mode feed-forward concept is shown in FIG. 6. The common-mode signal is extracted in much the same way as before, in the summation node 60. However, this time, after phase and amplitude conditioning of the CM correction signal in 150 and 152, it is injected to the output of the balun, rather than to the outputs of the individual amplifiers. For a good cancellation of distortion terms, there must be a good amplitude and phase match between the inserted correction signal and original distortion signal at the output of the balun. The match may be difficult to achieve and maintain over wide operating conditions (e.g. over multi-octave frequency range, unit-to-unit variations, etc.), particularly because the phase of the second harmonic at the output of the balun may not be predictable (e.g. it can have 180° uncertainty, due to unpredictable or inconsistent outcome of the signal subtraction in the balun), If, in a particular application, the phase of the distortion at the output of the balun is predictable and consistent in the entire operating frequency range, the phase and amplitude of the common-mode correction signal could possibly be optimized and can have fixed value for the entire range. In this case, the CM feed-forward can be used in applications requiring simultaneous bandwidth, i.e. where simultaneous processing of multiple channels is in question.

If, on the other hand, simultaneous coverage for the entire range is not possible due to circuit uncertainties, the embodiment of FIG. 6 could be used in special applications having single carrier at the time. An example is the agile channel up-converters, where one channel is processed at the time, but the unit must be tunable to any frequency in the operating frequency range. In this case, both phase and amplitude of the CM injection signal can be adjusted and controlled by phase control element 150 and amplitude control element 152 on a per channel basis. This can be accomplished, for instance, with a micro controller via control lines 158 and 160, where the optimum control values can be obtained by measurements of all channels and stored in a memory, or, more efficiently, computed by some algorithm, based on the combination of measurements of fewer number of channels and interpolation. For fixed frequency applications, the phase and amplitude could be manually adjusted.

The common-mode feed-forward could be used in combination with common-mode feedback, with simultaneous activity of both loops, sharing the same CM correction signal. The combination may be advantageous in some cases, where greater distortion improvement is required, but at the expense of higher complexity.

It should be noted that with embodiment of FIG. 6, in the case of a cascade of several different stages, not only distortions occurring within this circuit itself, but also any even order distortion occurring either before this stage or after this stage in a cascade can be corrected, by injecting a correction signal matched to the cumulative distortion term. Other embodiments of the present invention have the same ability (that is to correct the distortion generated not only in their own circuit, but also anywhere else in the system), provided that the entire cascade is differential, i.e. that there is no transitioning to single-ended drive within the cascade.

As mentioned earlier, choosing unequal (unbalanced) values for output and/or input coupling impedances (i.e. choosing unequal values of impedances 66 and 68 and/or unequal values of impedances 62 and 64 in FIG. 2A or FIG.

5) provides additional design choices for potential performance distortion improvements, as well as for signal balance improvements. The potential improvements can be achieved by counteracting imbalances that may exist elsewhere in the circuit, by offsetting coupling impedances in a way that would compensate (i.e. correct for) the effects of such other circuit imbalances. This way, the imbalances within the circuit itself can be compensated for, but furthermore, this can be used to the advantage for cancellation of distortion terms generated elsewhere in the system (e.g. in a cascade of multiple stages, where one or more stages generate distortions).

The potential benefit of unbalanced feedback impedances can be better understood with the help of the following analysis and examples.

The unequal impedances will result in unequal feedback coefficients in each arm of the push-pull circuits of FIG. 2A or FIG. 5. Using distortion equation (9) and inserting different feedback and distortion coefficients, the distortions at each amplifier output can be expressed with equations below:

$$\text{Distortion at one Amplifier Output} = \frac{D_1}{1 + 2\beta_{c1}A_1} \quad (13)$$

$$\text{Distortion at complementary Amplifier Output} = \frac{D_2}{1 + 2\beta_{c2}A_2} \quad (14)$$

where index 1 is associated with loop parameters of one arm and index 2 with the other, complementary arm of the push-pull amplifier of FIG. 2A or FIG. 5.

The values of feedback coefficients βc1 and βc2 in the above equations can be chosen to compensate the difference between distortion D1 and D2, resulting in equal distortion levels at the output of the two amplifiers (by solving eq. (13) and (14) for equal values). Alternatively, the coefficients βc1 and βc2 can be computed to yield unequal distortion levels, designed to compensate distortion occurring elsewhere in the system.

Once the desired values of βc1 and βc2 are determined, they can be realized by designing corresponding values of the coupling impedances. Alternatively, the desired (unequal) values of these coefficients can be achieved by splitting the common-mode signal amplifier 70 in FIG. 2A (or 138 in FIG. 5) into two amplifiers, each driving it's own arm and having a different gain (i.e. instead of one amplifier with gain G, use two amplifiers, one with gain G1 and the other with G2). By independently adjusting the gain of each amplifier, desired (different) residual distortion levels could be obtained in each arm. Variable gain amplifiers (suitable for integrated solutions) could also be used, where gain G1 and G2 are electronically controlled.

The coupling impedances can be designed either as fixed circuit parameters, or as adjustable (manually or electronically controlled) circuit parameters. Electronic control can be very beneficial in applications processing one frequency at the time, such as channel up-converters in CATV, where optimum imbalance control on a per channel basis can be realized, thus achieving minimum distortion levels for each channel. For electronic control, impedances Z1 and/or Z2 can be realized with varicap (varactors) tuning diodes and/or PIN (RF attenuator) diodes. For manual adjustments, variable (trimmer) capacitors and/or variable resistors (potentiometers) can be used.

Figure 8:
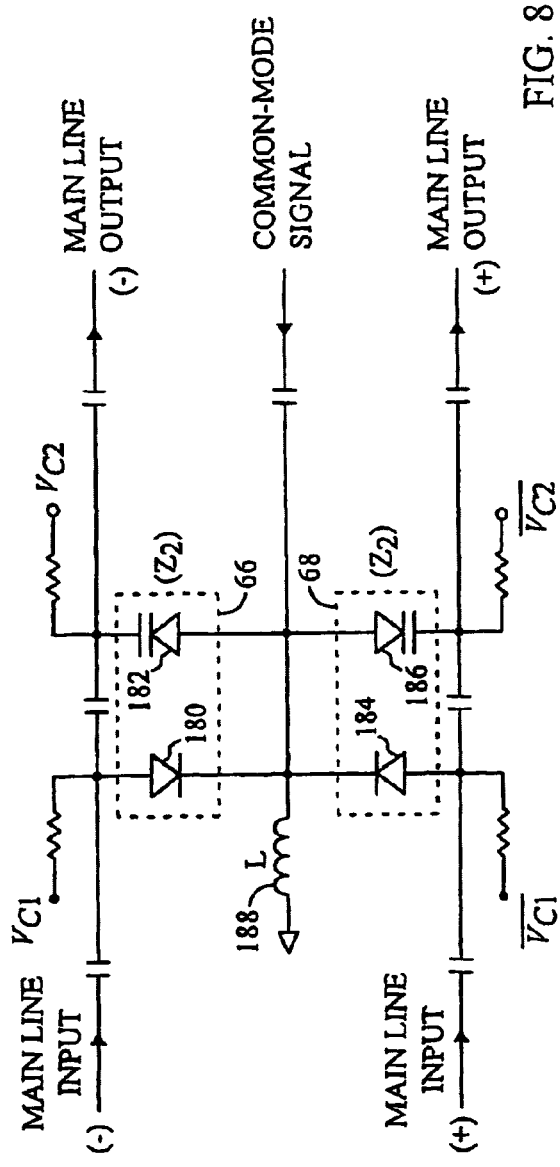
FIG. 8 is an example of the embodiment of an electronically controlled circuit for unbalancing of common-mode feedback or feed-forward coupling impedances, with the purpose of providing compensation for the effects of circuit imbalances.

An example of the embodiment of an electronically controlled circuit for unbalancing of Z1 or Z2 impedance pairs is illustrated in FIG. 8. This circuit can be used in place of impedance pairs 62/64 (Z1), and/or impedance pair 66/68 or 130/132 (Z2). The circuit contains PIN diodes for RF resistance control (180 and 184), and varactor diodes (182 and 186), for capacitance control. The components are connected in "back to back" configuration, in order to reduce distortions (if any) that may be generated by the non-linearity of these components themselves. The control of the impedance parameters is accomplished by the means of complementary (differential) DC control voltages $V_{c1}$, $\overline{V_{c1}}$ for PIN diodes control and $V_{C2}$, $\overline{V_{C2}}$ for varactor control, with common ground return via coil 188. For balanced impedance condition, differential control voltages are zero, i.e. complementary voltages are equal to each other $V_{c1}=\overline{V_{c1}}$ and $V_{c2}=\overline{V_{c2}}$. To affect the imbalance of the impedances, the voltages are tuned away from each other, in opposite directions. The biasing conditions and required biasing range can be determined based on PIN diodes and varactor diodes characteristics, as well as the impedance level and offset range required for the variable impedances. If preferred, differential control voltages can be replaced with single-ended drives, however, a little more complex circuit with multiple back-to-back diodes may be required in that case.

Those of skill in the art will recognize that the embodiments of the invention disclosed herein are for purposes of illustration only, and the claims should not be limited by such exemplary embodiments. For example, the present invention has been illustrated within the context of push-pull amplifiers, but can be applied to many other differential systems utilizing differential structure having complementary (out of phase) signals, with all the benefits described above for push-pull structure. It can be applied to wide variety of other nonlinear active or passive differential devices' where even order distortion products need to be improved, such as switches, attenuators, clock and line drivers, etc.

What is claimed is:

1. A differential circuit that reduces or eliminates even order harmonic distortion comprising:
a first active circuit element having an input and an output;
a second active circuit element having an input and an output;
a first pair of impedances connected in series with respect to each other and coupled with a first common node disposed therebetween, said first pair of impedances connected between respective outputs of said first and second active circuit elements;
a second pair of impedances connected in series with respect to each other and coupled with a second common node disposed therebetween, said second pair of impedances connected between respective inputs of said first and second active circuit elements;
a feedback connection connected between said first common node and said second common node;
a balun having first and second windings, the first winding of said balun being connected to said output of one of said first and second active circuit elements other than through said first pair of impedances, and the second winding of said balun being connected to said output of another of said first and second active circuit elements other than through said first pair of impedances; and whereby when respective signals are applied to said inputs of said first and second active circuit elements, said input and output of said second active circuit element are respectively substantially out of phase with respect to said input and output of said first active circuit element.

2. The differential circuit as claimed in claim 1, wherein a phase shift around an interconnected first loop defined by said first active circuit element, corresponding ones of said first and second impedances, and said feedback connection substantially equals 180?; and a phase shift around an interconnected second loop defined by said second active circuit element, corresponding ones of said first and second impedances, and said feedback connection substantially equals 180?.

3. The differential circuit as claimed in claim 1 wherein said first pair of impedances are passive.

4. The differential circuit as claimed in claim 1 wherein said second pair of impedances are passive.

5. The differential circuit as claimed in claim 1 wherein each impedance of one of said first and second pairs of impedances comprises a parallel combination of resistive and capacitive (R-C) components.

6. The differential circuit as claimed in claim 1 wherein said feedback connection is passive.

7. The differential circuit as claimed in claim 1 wherein said feedback connection comprises a third active circuit element having an input and output, said input of said third active circuit element being connected to said first common node, and said output of said third active circuit element being connected to said second common node.

8. The differential circuit as claimed in claim 1 wherein said first winding of said balun is connected between a non-grounded output signal terminal and said output of said one of said first and second active circuit elements, and the second winding of said balun is connected between a grounded connection and said output of said another of said first and second active circuit elements.

9. The differential circuit as claimed in claim 1 further comprising another balun having first and second windings connected to respective inputs of said first and second active circuit elements.

10. The differential circuit as claimed in claim 9 wherein said first winding of said another balun is connected between an input signal source and said input of one of said first and second active circuit elements other than through said second pair of impedances, and said second winding of said another balun is connected between a grounded connection and said input of another of said first and second active circuit elements other than through said second pair of impedances.

11. The differential circuit as claimed in claim 9 wherein said balun and said another balun are connected diagonally symmetrically such that said first winding of said balun is connected between a non-grounded output signal terminal and said output of said one of said first and second active circuit elements and said first winding of said another balun is connected between a non-grounded input signal source and said input of said another of said first and second active circuit elements.

12. A push-pull amplifier system comprising the differential circuit as claimed in claim 1.

13. A frequency up-converter system comprising the differential circuit as claimed in claim 1.

14. A differential circuit that reduces or eliminates even order harmonic distortion comprising:

a first active circuit element having an input and an output;

a second active circuit element having an input and an output;

a first pair of impedances connected in series with respect to each other and coupled with a first common node disposed therebetween, said first pair of impedances connected between respective outputs of said first and second active circuit elements;

a second pair of impedances connected in series with respect to each other and coupled with a second common node disposed therebetween, said second pair of impedances connected between respective inputs of said first and second active circuit elements;

a feedback connection connected between said first common node and said second common node;

wherein a selected pair of said first pair of impedances and said second pair of impedances comprises an electronically controlled circuit for varying a degree of imbalance between respective impedances of said selected pair of impedances; and whereby when respective signals are applied to said inputs of said first and second active circuit elements, said input and output of said second active circuit element are respectively substantially out of phase with respect to said input and output of said first active circuit element.

15. The differential circuit as claimed in claim 14, wherein said electronically controlled circuit further comprises PIN diodes and varactor diodes connected in a back-to-back arrangement with a common ground return.

16. A differential circuit that reduces or eliminates even order harmonic distortion comprising:

a first active circuit element having an input and an output;

a second active circuit element having an input and an output;

a first pair of impedances connected in series with respect to each other and coupled with a first common node disposed therebetween, said first pair of impedances connected between respective outputs of said first and second active circuit elements;

a second pair of impedances connected in series with respect to each other and coupled with a second common node disposed therebetween, a first end of said series connected second pair of impedances and an output of one of said first and second active circuit elements being connected to respective inputs of a first combiner or directional coupler, and a second end of said series connected second pair of impedances and an output of another of said second active circuit elements being connected to respective inputs of a second combiner or directional coupler; and a feed-forward connection connected between said first common node and said second common node; and whereby when respective signals are applied to said inputs of said first and second active circuit elements, corresponding outputs of said first and second active circuit elements are substantially out of phase with respect to each other.

17. The differential circuit as claimed in claim 16 wherein said first pair of impedances are passive.

18. The differential circuit as claimed in claim 16 wherein said second pair of impedances are passive.

19. The differential circuit as claimed in claim 16 wherein said first and second combiners are direct connections.

20. The differential circuit as claimed in claim 16 wherein each impedance of one of said first and second pairs of impedances comprises a parallel combination of resistive and capacitive (R-C) components.

21. The differential circuit as claimed in claim 16 wherein said feed-forward connection is passive.

22. The differential circuit as claimed in claim 16 wherein said feed-forward connection comprises a third active circuit element having an input and output, said input of said third active circuit element being connected to said first common node, and said output of said third active circuit element being connected to said second common node.

23. The differential circuit as claimed in claim 16 further comprising a balun having first and second windings connected to respective outputs of said first and second combiners or directional couplers.

24. The differential circuit as claimed in claim 23 wherein said first winding of said balun is connected between an output signal terminal and said output of one of said first and second combiners or directional couplers, and said second winding of said balun is connected between a grounded connection and said output of another of said first and second combiners or directional couplers.

25. The differential circuit as claimed in claim 16 further comprising a balun having first and second windings connected to respective inputs of said first and second active circuit elements.

26. The differential circuit as claimed in claim 25 wherein said first winding of said balun is connected between an input signal source and said input of one of said first and second active circuit elements, and said second winding of said balun is connected between a grounded connection and said input of another of said first and second active circuit elements.

27. The differential circuit as claimed in claim 16 further comprising first and second baluns each having a pair of windings and connected diagonally symmetrically such that one of said pair of windings of said first balun is connected between a non-grounded, input signal source and said input of one of said first and second active circuit-elements, and one of said pair of windings of said second balun is connected between a non-grounded output signal terminal and said output of said combiner or directional coupler that has one of its input connected to said output of another of said first and second active circuit elements.

28. A push-pull amplifier system comprising the differential circuit as claimed in claim 16.

29. A frequency up-converter system comprising the differential circuit as claimed in claim 16.

* * * * *

UNITED STATES PATENT AND TRADEMARK OFFICE
CERTIFICATE OF CORRECTION

PATENT NO. : 7,005,919 B2  Page 1 of 1
DATED : February 28, 2006
INVENTOR(S) : Petrovic et al.

It is certified that error appears in the above-identified patent and that said Letters Patent is hereby corrected as shown below:

Column 19,
Lines 11 and 15, delete "180?" and replace with -- 180° --.

Signed and Sealed this

Second Day of May, 2006

JON W. DUDAS
*Director of the United States Patent and Trademark Office*